(12) United States Patent
Sumi et al.

(10) Patent No.: US 7,291,789 B2
(45) Date of Patent: *Nov. 6, 2007

(54) COPPER PASTE AND WIRING BOARD USING THE SAME

(75) Inventors: Hiroshi Sumi, Aichi (JP); Hidetoshi Mizutani, Aichi (JP); Manabu Sato, Nagoya (JP)

(73) Assignee: NGK Spark Plug Co., Ltd., Aichi (JP)

( * ) Notice: Subject to any disclaimer, the term of this patent is extended or adjusted under 35 U.S.C. 154(b) by 477 days.

This patent is subject to a terminal disclaimer.

(21) Appl. No.: 10/620,361

(22) Filed: Jul. 17, 2003

(65) Prior Publication Data
US 2005/0051356 A1 Mar. 10, 2005

(30) Foreign Application Priority Data
Jul. 17, 2002 (JP) ............... P. 2002-208320

(51) Int. Cl.
*H05K 1/09* (2006.01)
(52) U.S. Cl. ............... 174/257; 252/512
(58) Field of Classification Search ........ 174/255–257; 252/512–514
See application file for complete search history.

(56) References Cited

U.S. PATENT DOCUMENTS

| | | | |
|---|---|---|---|
| 4,070,518 A * | 1/1978 | Hoffman ............... 428/209 |
| 4,234,367 A | 11/1980 | Herron et al. |
| 4,816,615 A | 3/1989 | Prabhu et al. |
| 4,880,567 A | 11/1989 | Prabhu et al. |
| 5,336,444 A | 8/1994 | Casey et al. |
| 5,439,852 A | 8/1995 | Hormadaly |
| 5,468,445 A | 11/1995 | Casey et al. |
| 5,976,628 A | 11/1999 | Kawahara et al. |
| 6,077,564 A | 6/2000 | Thimm |
| 6,132,543 A * | 10/2000 | Mohri et al. ............ 156/89.12 |
| 6,156,237 A | 12/2000 | Kubota et al. |
| 6,193,910 B1 | 2/2001 | Ikai et al. |
| 6,217,989 B1 * | 4/2001 | Brody et al. ............ 428/209 |
| 6,855,399 B2 * | 2/2005 | Sumi et al. ............ 428/209 |
| 6,919,124 B2 * | 7/2005 | Ito ............... 428/210 |

FOREIGN PATENT DOCUMENTS

| | | |
|---|---|---|
| EP | 0 698 590 A2 | 2/1996 |
| JP | 55-128899 | 10/1980 |
| JP | 63131405 | * 6/1988 |
| JP | 63-174203 | 7/1988 |
| JP | 1-128488 | 5/1989 |

(Continued)

OTHER PUBLICATIONS

Abstract of JP63-131405.*

(Continued)

*Primary Examiner*—Jeremy C Norris
(74) *Attorney, Agent, or Firm*—Sughrue Mion Pllc.

(57) ABSTRACT

A wiring board comprising: a conductor layer comprising Fe and Cu; and at least one of a radiator, a connection terminal, a cover and a circuit component, connected to the conductor layer through a joining member, which is obtained by coating a copper paste comprising a copper powder, an organic vehicle and an $Fe_2O_3$ particle as a conductor layer on a ceramic green sheet and firing it.

13 Claims, 1 Drawing Sheet

FOREIGN PATENT DOCUMENTS

| | | |
|---|---|---|
| JP | 5-81922 | 4/1993 |
| JP | 5-243700 | 9/1993 |
| JP | 6-56545 | 3/1994 |
| JP | 8-148783 | 6/1996 |
| JP | 2578273 | 11/1996 |
| JP | 10-95686 | 4/1998 |
| JP | 11-284296 | 10/1999 |
| JP | 2000-67646 * | 3/2000 |

OTHER PUBLICATIONS

Machine translation of JP 2000-67646.*

Patent Abstracts of Japan, vol. 014, No. 493, Oct. 26, 1990 & JP 02 204904 A (Asahi Glass Co Ltd), Aug. 14, 1990.

* cited by examiner

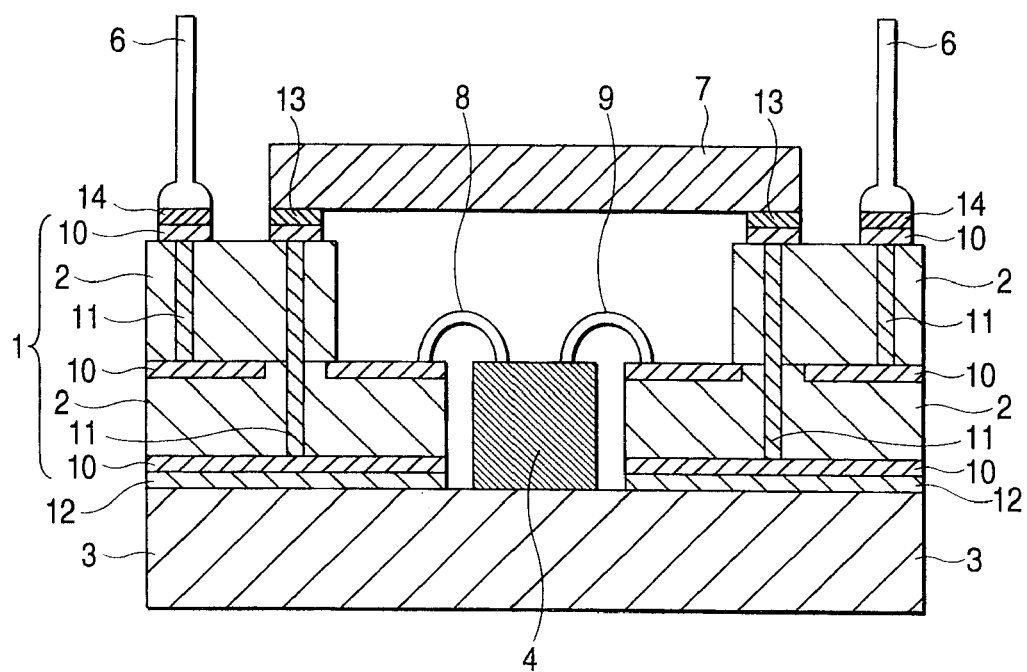

COPPER PASTE AND WIRING BOARD USING THE SAME

FIELD OF THE INVENTION

The present invention relates to a copper paste which is printed on a ceramic substrate and simultaneously fired to form a circuit, and a wiring board using the copper paste. More specifically, the present invention relates to a copper paste for use in a wiring board where a circuit component is connected by a joining method such as brazing, and also relates to a wiring board using the copper paste. The wiring board is preferably produced by low temperature co-fired ceramics (LTCC).

BACKGROUND OF THE INVENTION

In recent years, accompanying the speeding up of information communication, the wiring board is used in a high frequency region of GHz band or more and demanded to be reduced in the transmission loss. To satisfy this requirement, the wiring board is produced by forming a conductor layer composed of a metal having a low conductor resistance and a low melting point, such as silver and copper, on a ceramic substrate having a relatively low dielectric constant. With the progress of high-density packaging of a circuit, copper is used for the conductor layer so as to prevent migration. The ceramic substrate having printed thereon copper as the conductor layer is fired in a wet nitrogen atmosphere (in a mixed atmosphere of water vapor and nitrogen gas) so as to obtain a wiring board reduced in the transmission loss while preventing the oxidation of copper.

Generally, for producing a wiring board, a slurry is prepared using a ceramic raw material powder and an organic binder, a solvent or the like and formed into a ceramic green sheet by a sheet-forming method such as doctor blade method. Thereafter, a wiring pattern is printed on the ceramic green sheet by using a copper paste and dried. Subsequently, the ceramic green sheet is debindered at a temperature of hundreds of ° C. in a mixed atmosphere of water vapor and nitrogen gas to remove organic components contained in the copper paste and ceramic green sheet and then fired by elevating the temperature to nearly 1,000° C. or more, thereby producing a wiring board.

With the progress of high-density packaging and multi-functionalization of equipment, a semiconductor element such as transistor and diode, heat radiation parts, terminals and various circuit components are mounted and therefore, the adhesive strength of the conductor layer formed on a wiring board is demanded to have higher reliability.

Particularly, in a wiring board having mounted thereon a semiconductor element such as transistor and diode, the semiconductor element generates heat due to input signal to cause elevation of temperature and this causes deterioration in the properties of semiconductor element or other circuit component mounted on the circuit board. Therefore, heat radiation is important. For this purpose, in the wiring board, a radiator is connected through a conductor layer in many cases and the conductor layer formed on the wiring board is required to have an adhesion strength high enough to cause no bulging or separation against heat load.

As a technique for preventing the bulging or separation of the semiconductor layer formed on a wiring board, a method of using a thick film copper conductor ink as the copper paste described in JP-A-1-128488 (the term "JP-A" as used herein means an "unexamined published Japanese patent application") is known.

In the thick film copper conductor ink described in JP-A-1-128488, by taking notice of the fact that an organic vehicle contained in a conductor ink generates a gas in the firing step to cause bulging or separation of the conductor layer, a devitrifying glass flit selected from a zinc-calcium aluminum silicate glass flit, a zinc-magnesium-barium-aluminum silicate glass flit and a mixture thereof, and a specific oxide such as bismuth oxide and cadmium oxide are added to the copper paste to thereby suppress the generation of gas and prevent the separation or bulging of conductor layer.

SUMMARY OF THE INVENTION

However, the thick film copper conductor ink described in JP-A-1-128488 has a problem in that when this is used as a conductor layer for a wiring board, since a glass flit is added, the glass comes up to the conductor layer surface and remains there to impair the soldering or plating property and also in that when the wiring board is heated, bulging or separation of the conductor layer occurs and the technique of preventing bulging is insufficient.

An object of the present invention is to solve these problems and provide a copper paste and a wiring board using the copper paste, which can ensure, in the wiring board using copper for the conductor layer, good plating or soldering property of the conductor layer, no generation of bulging or separation of the conductor layer even when the wiring board is heated, and highly reliable connection of a semiconductor element such as transistor and diode, heat radiation parts, terminals and various circuit components.

A first aspect of the invention created to achieve the above-described object is a copper paste comprising a copper powder, an organic vehicle and an $Fe_2O_3$ particle. The lower limit of the amount of the organic vehicle is not limited, but preferably, the copper paste comprises more than 20 parts by mass of the organic vehicle per 100 parts by mass of the copper powder. The upper limit of the amount of the organic vehicle is not limited, but preferably, the copper paste comprises no more than 40 parts by mass (more preferably, no more than 25 parts by mass) of the organic vehicle per 100 parts by mass of the copper powder.

The copper paste contains an $Fe_2O_3$ particle and therefore, by firing it in a non-oxidizing atmosphere, a conductor layer having excellent adhesive strength to the wiring board is formed and a wiring board excellent in the adhesive strength of conductor layer can be obtained, where even when a semiconductor such as transistor and diode, heat radiation parts, terminals and various circuit components are connected under heating to the wiring substrate by a joining method, for example, soldering or brazing using a joining member such as various low-melting point alloys, bulging or separation of the conductor layer does not occur.

The reason why the adhesive strength of the conductor layer is enhanced by adding an $Fe_2O_3$ particle to the copper paste is presumed as follows.

Generally, the copper metal is known to exhibit poor wettability to the liquid phase components in the low-temperature firing porcelain material at the firing step of producing a wiring board and therefore, the adhesion between the low-temperature firing porcelain material and the copper metal is bad. A method of adding a copper oxide to the copper paste to enhance the wettability to the liquid phase component in the low-temperature firing porcelain material and thereby improving the adhesive property of copper metal is known. However, when the siring board obtained by this method is heated in a joining step such as brazing, the conductor layer is bulged and the adhesion between the conductor layer and the wiring board is insufficient.

That is, when a copper paste having added thereto a copper oxide is used, the adhesion surface between the wiring board and the conductor layer is composed of a mixture of an interface where an metal oxide is present and an interface where a metal oxide is not present and upon heating, bulging is generated from the interface where a metal oxide is not present (interface having poor adhesive property) and elicited.

Therefore, in the present invention, an $Fe_2O_3$ particle is added to the copper paste, whereby an interface where a metal oxide is uniformly present is formed throughout the adhesion surface between the wiring board and the conductor layer and the adhesion of the conductor layer to the wiring board is enhanced.

When an $Fe_2O_3$ particle is added to the copper paste and the system is transferred to a temperature higher than 700° C. at the firing step, a chemical reaction takes place according to the following formula (1):

$$2Cu + 3Fe_2O_3 \rightarrow Cu_2O + 2Fe_3O_4 \quad (1)$$

Namely, it is considered that the $Fe_2O_3$ acts as an oxidizing agent for Cu in the firing temperature region and slightly oxidizes the entire Cu.

At this time, the amount of Cu oxidized is very small but the entire Cu is uniformly oxidized, as a result, the wettability of copper to the liquid phase component of the low-temperature firing porcelain material is entirely enhanced at the firing and the generation of local bulging is prevented.

The $Fe_2O_3$ is an iron oxide particle mainly comprising $Fe_2O_3$ and may contain an iron oxide (for example, $Fe_3O_4$ or FeO) other than $Fe_2O_3$, or a Fe metal.

The average particle size of the $Fe_2O_3$ is preferably 1 μm or less, because Fe is not unevenly dispersed in the conductor layer and the effect of preventing bulging of the conductor layer increases. The average particle size of $Fe_2O_3$ is more preferably 500 nm or less, still more preferably 100 nm or less, because even by the addition of $Fe_2O_3$ particle in a small amount, the bulging inhibiting effect is brought out. The lower limit of the average particle size of the $Fe_2O_3$ is not limited, but preferably 5 nm.

The amount of the $Fe_2O_3$ added is preferably from 0.1 to 10.0 parts by mass (weight), because if the amount of $Fe_2O_3$ added is no less than 0.1 part by mass, the effect of preventing bulging of the conductor layer increases, whereas if the amount of $Fe_2O_3$ is no more than 10.0 part by mass, the conductor resistance decreases. The amount of $Fe_2O_3$ added is more preferably from −0.1 to 5.0 parts by mass, still more preferably from 0.1 to 2.0 parts by mass, because this range is optimal for preventing the bulging without increasing the conductor resistance.

The average particle size of the copper powder is preferably from 0.5 to 10 μm, because if the average particle size of the copper powder is no less than 0.5 μm, the case that the sintering initiation temperature of copper excessively decreases and warping or waving may be generated on the wiring board is prevented, whereas if the average particle size of the copper powder is no more than 10 μm, a fine wiring pattern is easy to form on the wiring board. The average particle size of the copper powder is more preferably from 1 to 7 μm or from 2 to 5 μm, because this range is optimal for achieving both the prevention of bulging and the formation of fine wiring. The copper powder may have any shape such as nearly spherical, dendritic or flake form.

The organic vehicle content is obtained by dissolving an organic polymer in an organic solvent and at least one organic polymer such as ethyl cellulose, acrylic resin, polymethylstyrene, butyral resin, PTFE, alkyd resin and polyalkylene carbonate is used therefor. In particular, an acrylic resin is preferred, and poly-n-butyl methacrylate and poly-2-ethylhexyl methacrylate are more preferred, because the decomposability at the firing is enhanced and a dense conductor layer having low resistance can be obtained.

The organic solvent is preferably a high boiling point solvent such as terpineol, butylcarbitol acetate, butylcarbitol and dibutyl phthalate.

In the copper paste, components such as plasticizer, thickening agent, leveling agent and defoaming agent may also be contained.

A viscosity of the copper paste of the invention is not limited, but preferably no less than 30 poises (3 pa.sec) and lower than 5000 poises, more preferably from 300 to 1000 poises at 23° C.

The copper paste preferably comprises a ceramic particle having an average particle size of 100 nm or less (a second aspect of the invention).

The copper paste of the second aspect contains a ceramic particle having an average particle size of 100 nm or less so as to enhance the plating property or sinterability of the copper powder and therefore, a wiring board having good plating or soldering property and reduced in the warping or waving is obtained.

The average particle size of the ceramic particle is preferably 100 nm or less, because waving is not readily generated on the wiring board or the plating property of the conductor layer is not impaired. The average particle size of the ceramic particle is more preferably 50 nm or less, still more preferably 30 nm or less, because this range is optimal for preventing the waving or bringing out the plating property. The lower limit of the average particle size of the ceramic particle is not limited, but preferably 5 nm.

The amount of the ceramic particle added is preferably from 0.1 to 5.0 parts by mass per 100 parts by mass of the copper powder, because if the amount of the ceramic particle added is no less than 0.1 part by mass, the effect of preventing the waving is readily obtained or the plating property of the conductor layer may not be deteriorated, whereas if the amount of the ceramic particle added is no more than 5.0 parts by mass, the sinterability of copper is not impaired. The amount of the ceramic particle added is more preferably from 0.1 to 1.0 part by mass, because this range is optimal for preventing the waving or bringing out the plating property.

In order to enhance the sinterability of copper, the ceramic particle may be selected from a vitreous ceramic particle and a material which is vitrified after sintering. Particularly, $SiO_2$ is preferred, because the waving can be prevented by the addition in a small amount and the coming up of glass to the conductor layer surface can be decreased.

The ceramic particle vitrifiable after sintering for use in the present invention is a ceramic particle which is fired and thereby melted into the glass contained in the ceramic green sheet. Examples thereof include glass-forming oxides such as crystalline $SiO_2$ and $B_2O_3$, and oxides of alkali metals and alkaline earth metals, such as MgO, CaO, $Na_2O$ and $K_2O$.

The ceramic particle preferably has a hydrophilic surface, because if hydrophobed, the decomposability of organic components is worsened and this gives rise to increase in the residual carbon amount.

In order to enhance the plating property of the conductor layer, the ceramic fine particle may also be selected from ceramic powders which are not vitrified by the firing together with a ceramic green sheet and at the same time, not vitrified by reacting with additives contained in the composition constituting the ceramic green sheet or in the copper paste.

The ceramic powder which is not vitrified is selected from those containing at least one member selected from, for example, $Al_2O_3$, $TiO_2$, $CeO_2$ and mullite. In particular, $TiO_2$ is preferred, because the waving amount of the wiring board can be reduced an the adhesive strength of the conductor layer is more enhanced.

The ceramic powder non-vitrifiable after sintering as used in the present invention means a crystalline ceramic which is not vitrified by reacting with additives contained in the ceramic green sheet or copper paste.

The non-vitrifiable ceramic powder is selected from those containing at least one member of $Al_2O_3$, $TiO_2$, $CeO_2$ and mullite. More specifically, the construction material is appropriately selected by individually taking care not to react with additives contained in the ceramic green sheet or copper paste. In particular, $TiO_2$ is preferred because the waving amount of wiring board can be reduced and the adhesion strength of conductor layer is more increased.

The ceramic particle for enhancing the sinterability of copper and the ceramic particle for enhancing the plating property of conductor layer may be used separately but in order to bringing out advantageous properties of two ceramic particles in good balance, these ceramic particles may be used as a mixture at an appropriate ratio.

A third aspect of the invention is a wiring board obtained by coating the copper paste of the first or the second aspect on a ceramic substrate and firing it.

The wiring board of the third aspect provides an operational effect that the conductor layer is not bulged or separated even when the wiring substrate is heated, and also the conductor layer is favored with good plating or soldering property.

A fourth aspect of the invention is the wiring board of the third aspect, wherein at least one of a radiator, a connection terminal, a cover and a circuit component is connected to the conductor layer through a brazing material.

According to the wiring board of the fourth aspect, even when a brazing material is melted to connect a radiator, a connection terminal or a circuit component, separation or bulging of the conductor layer does not occur and therefore, in a wiring board where a heat radiation member, a connection terminal for packaging, a cover for enclosing an electronic component (e.g., semiconductor element) of generating heat, a circuit component and the like is connected, high reliability can be obtained.

Examples of the radiator include a heat sink and a thermal via. Examples of the connection terminal include a pin terminal, a lead terminal, a flip chip terminal, a land terminal and a solder ball terminal. Examples of the cover include a plate-like metal-made lid and a ceramic-made lid. Examples of the circuit component include electronic components such as semiconductor element, condenser, inductor and resistor.

As the brazing material used for connecting metal fittings, various low melting point alloys such as solder (Sn—Pb alloy), Au solder, Ag solder and. Cu solder can be used. The melting point of the alloy is preferably 270 to 800° C. If the melting point is no less than 270° C., the case that the alloy may be melted by the soldering at the PCB packaging to shift the fitting position can be prevented, whereas if it is no more than 800° C., this is not close to the softening point of glass used for the wiring board and deformation of the wiring board does not occur. The alloy more preferably has a melting point of 300 to 600° C., still more preferably from 300 to 500° C., because the alloy having such a melting point is easy to handle.

A fifth as aspect of the invention is a wiring board obtained by forming a conductor layer on a wiring board by using an Fe-containing Cu metal, and then connecting at least one of a radiator, a connection terminal, a cover and a circuit component to the conductor layer through a joining member.

According to the wiring board of the fifth aspect, even when a brazing material is melted to connect a radiated, a connection terminal, a cover or a circuit component, separation or bulging of the conductor layer does not occur and therefore, in a wiring board where a heat radiation member, a connection terminal for packaging, a cover for enclosing an electronic component (e.g., semiconductor element) of generating heat, a circuit component and the like is connected, high reliability can be obtained. When a metallic member is connected to the wiring board of the invention, the connection may be made by metalization.

Examples of the radiator, the connection terminal, the cover, the circuit component and the brazing material are described above.

A sixth aspect of the invention is the wiring board of the fifth aspect, wherein the surface of the conductor layer is subjected to a plating treatment.

According to the wiring board of the sixth aspect, a good plating treatment is obtained on the conductor layer surface, bulging or separation does not occur in the conductor layer, plating and the like even when the wiring board is heated, and high reliability is gained in the connection of a semiconductor element such as transistor and diode, radiation parts, terminals and various circuit components.

BRIEF DESCRIPTION OF THE DRAWING

The Drawing

The drawing is a cross-sectional view showing the structure of a wiring board according to the embodiment of the present invention.

DESCRIPTION OF NUMERICAL REFERENCES

1: wiring board, 2: substrate, 3: radiator, 4: semiconductor element, 6: connection terminal, 7: cover, 8 and 9: wire bonding, 10 and 11: conductor layer, and 12, 13 and 14: brazing material.

DETAILED DESCRIPTION OF THE INVENTION

Embodiment 1

The present invention is described below by referring to Embodiments.

[Production of Ceramic Green Sheet]

A mixed powder having a particle size of 2.5 µm was prepared by mixing 50 parts by mass of an alumina filler with a glass powder having a composition such that $SiO_2$ was 31.65 parts by mass, $B_2O_3$ was 12.05 parts by mass, $Al_2O_3$ was 2.85 parts by mass and CaO was 3.45 parts by mass.

Thereafter, 20 parts by mass of a binder comprising acrylic resin, 10 parts by mass of a plasticizer comprising dibutyl phthalate and an appropriate amount of a toluene- MEK mixed solvent were added per 100 parts by mass of the mixed powder to prepare a slurry.

The obtained slurry was formed into a ceramic green sheet having a thickness of 250 μm by a sheet formation method such as doctor blade method. This ceramic green sheet is a low-temperature firing green sheet which can be fired at a relatively low temperature (1,000° C. here).

[Production of Copper Paste]

Thereafter, 25 parts by mass of a vehicle and an additive shown in Table 1 were added to 100 parts by mass of a copper powder having an average particle size of 2.8 μm and these were mixed by a three-roll mill to produce a copper paste. The vehicle used here was prepared by dissolving 30 parts by mass of polyisobutyl methacrylate in 70 parts by mass of terpineol.

TABLE 1

| | Copper Paste Composition, Kind and Amount Added of Additive (parts by mass) | | | Adhesion Strength (kgf) | Bulging |
|---|---|---|---|---|---|
| Example A | $Fe_2O_3$ 1.0 part by mass | $SiO_2$ 1.0 part by mass | none | 3.11 | none |
| Example B | $Fe_2O_3$ 1.0 part by mass | $SiO_2$ 1.0 part by mass | $TiO_2$ 0.5 parts by mass | 4.31 | none |
| Comparative Example A | none | $SiO_2$ 1.0 part by mass | $TiO_2$ 0.5 parts by mass | 2.13 | bulged |
| Comparative Example B | CuO 1.0 part by mass | $SiO_2$ 1.0 part by mass | $TiO_2$ 0.5 parts by mass | 3.98 | bulged |
| Comparative Example C | NiO 1.0 part by mass | $SiO_2$ 1.0 part by mass | $TiO_2$ 0.5 parts by mass | 2.53 | bulged |

As shown in Table 1, copper pastes having the compositions of Examples A and B were produced as Examples of the present invention and also, copper pastes having the compositions of Comparative Examples A to C were produced for comparison with the effect of the present invention.

Example A is a copper paste where 1.0 parts by mass of $Fe_2O_3$ having an average particle size of 21 nm and 1.0 part by mass of $SiO_2$ having an average particle size of 12 nm were added per 100 parts by mass of the copper powder.

Example B is a copper paste where 1.0 parts by mass of $Fe_2O_3$ having an average particle size of 21 nm, 1.0 part by mass of $SiO_2$ having an average particle size of 12 nm and 0.5 parts by mass of $TiO_2$ having an average particle size of 21 nm were added per 100 parts by mass of the copper powder.

Comparative Example A is a copper paste where 1.0 part by mass of $SiO_2$ having an average particle size of 12 nm and 0.5 parts by mass of $TiO_2$ having an average particle size of 21 nm were added per 100 parts by mass of the copper powder.

Comparative Example B is a copper paste where 1.0 parts by mass of CuO having an average particle size of 20 nm, 1.0 part by mass of $SiO_2$ having an average particle size of 12 nm and 0.5 parts by mass of $TiO_2$ having an average particle size of 21 nm were added per 100 parts by mass of the copper powder.

Comparative Example C is a copper paste where 1.0 parts by mass of NiO having an average particle size of 20 nm, 1.0 part by mass of $SiO_2$ having an average particle size of 12 nm and 0.5 parts by mass of $TiO_2$ having an average particle size of 21 nm were added per 100 parts by mass of the copper powder.

[Production of Fired Sample]

The copper pastes of Examples A and B and Comparative Examples A, B and C shown in Table 1 each was printed on the ceramic green sheet and fired to produce fired samples.

First, the ceramic green sheet was cut into a dimension of 50 mm (length)×60 mm (width) to prepare ceramic green sheet strips and Specimen A where the copper paste was printed to a dimension of 2 mm (length)×2 mm (width)×20 μm (thickness) on the nearly center part of the ceramic green sheet strip and Sample B where the copper paste was printed to a dimension of 15 mm (length)×15 mm (width)×20 μm (thickness) in the nearly center part of the ceramic green sheet strip were produced.

Subsequently, one sheet of Specimen A and three green sheets not printed with the copper paste, that is, four sheets in total, were stacked and pressed to produce Stacked Body A where the printed surface of Specimen A came to the top face. Also, one sheet of Specimen A and three green sheets not printed with the copper paste, that is, four sheets in total, were stacked and pressed to produce Stacked Body B where the printed surface of Specimen B came to the top face.

Stacked bodies A and B each was exposed in a furnace having prepared therein a mixed atmosphere of water vapor and nitrogen gas (dew point:70° C.) and left standing at a temperature of 850° C. to degrease the organic components contained in the copper paste and ceramic green sheet. Subsequently, the temperature was elevated to 1,000° C. and each stacked body was left standing for 2 hours and thereby fired to produce Fired Samples A and B each having on the top face thereof a conductor layer.

Fired Sample A was obtained by firing Stacked Body A and used for the evaluation of adhesive strength, which is described later. Fired Sample B was obtained by firing Stacked Body B and used for the evaluation of bulging of the conductor layer, which is described later.

[Evaluation of Adhesive Strength]

On the top surface of the conductor layer of Fired Sample A, a tin-plated wire having a diameter of 0.45 mm was soldered. This wire was pulled and a tensile load in the direction perpendicular to the top face of Fired Sample A was applied. The load at the time when the conductor layer was separated is shown as the adhesive strength in Table 1.

[Evaluation of Bulging of Conductor Layer]

An Ni plating in a thickness of 4 μm was applied to the top face of the conductor layer of Fired Sample B by an electrolytic plating method and an Au plating in a thickness of 0.5 μm was further applied to the top face of the Ni plating by an electrolytic plating method.

The fired sample to which Au plating was applied was placed in a furnace heated at 390° C. for several minutes and thereafter, the presence or absence of bulging of the conductor layer was observed with an eye. The results obtained are shown in Table 1.

As seen in Table 1, in Examples A and B of the present invention, the conductor layer was not bulged even when heated at 390° C. and a good appearance was obtained. On the other hand, in Comparative Examples A, B and C, bulging of the conductor layer was generated when heated at 390° C.

When Comparative Example A is compared with Example B of the present invention, in Comparative Example A, $Fe_2O_3$ as the additive was not added, as a result, bulging was generated upon heating.

When Comparative Example B is compared with Example B of the present invention, in Comparative Example B, CuO was added as an oxide in place of $Fe_2O_3$, as a result, the adhesive strength was almost the same as that in Example B of the present invention but bulging was generated upon heating.

When Comparative Example C is compared with Example B of the present invention, in Comparative Example C, NiO was added as the additive in place of $Fe_2O_3$, as a result, bulging was generated upon heating and the adhesive strength was low.

When Examples A and B of the present invention are compared, by further adding $TiO_2$ as the additive, the adhesive strength was more enhanced.

Embodiment 2

Using the ceramic green sheet produced in Embodiment 1 and the copper paste having the composition of Example B of Embodiment 1, a wiring board was produced.

The drawing is a cross-sectional view showing the structure of a wiring board according to the embodiment of the present invention.

In the drawing, 1 is a wiring board and the wiring board 1 comprises a ceramic substrate 2 formed by stacking a plurality of ceramic green sheets and firing them, a radiator 3 joined to the bottom face of the ceramic substrate 2 through a brazing material 12, a semiconductor element 4 inserted in the hole of the ceramic substrate 2 and disposed on the top face of the radiator 3, a cover 7 shielding the hole of the ceramic substrate 2 to cover the semiconductor 4 and connected to the conductor layer 10 through a brazing material 13, and a connection terminal 6 connected to the conductor layer 10 on the top face of the ceramic substrate 2 through a brazing material 14.

The ceramic substrate 2 was produced by printing the copper paste of Example B on the ceramic green sheet, drying it, stacking a plurality of these ceramic green sheets to obtain a stacked body, performing the degreasing in a wet nitrogen atmosphere at 850° C. and firing the stacked body at 1,000° C. for 2 hours. Every each stacking of ceramic green sheets, the wiring circuits on the plurality of ceramic green sheets were connected by a conductor layer 11.

In the conductor layer 10, the portion exposed to the surface of the ceramic substrate 2 was plated with Ni to a thickness of 4 μm by an electroless plating method and the top face of the Ni plating was further plated with Au to a thickness of 0.5 μm by an electroless plating method.

The radiator 3 was formed of an Ni—Au-plated copper-tungsten alloy and joined to the Ni—Au-plated conductor layer on the back surface of the ceramic substrate 2 by brazing. At this time, the brazing was performed by using a brazing material 12 composed of a gold-germanium alloy and heating it at about 390° C.

The bottom face of the semiconductor element 4 was bonded to the top face of the radiator 3 and terminals (not shown) formed on the top face of the semiconductor element 4 were connected to the Ni—Au-plated conductor layer 10 of the ceramic substrate 2 through wire bondings 8 and 9.

The cover 7 was formed of an Ni—Au-plated Ni—Co—Fe alloy and joined to the Ni—Au-plated conductor layer 10 on the top face of the ceramic substrate 2 by brazing. At this time, the brazing was performed by using a brazing material 13 composed of a gold-germanium alloy and heating it at about 390° C.

The connection terminal 6 was formed of an Ni—Au-plated copper-Fe alloy and joined to the Ni—Au-plated conductor layer 10 on the top face of the ceramic substrate 2 by brazing. At this time, the brazing was performed by using a brazing material 14 composed of a gold-germanium alloy and heating it at about 390° C.

The operational effects of the copper paste and wiring board using the copper paste according to the embodiment of the present invention having the above-described constitutions are described below.

When the copper paste according to the embodiment of the present invention is used, excellent adhesion strength is obtained between a ceramic substrate 2 and a conductor layer 10 in a wiring board 1 and therefore, a wiring board having high reliability can be obtained without causing bulging or separation of the conductor layer 10 even when a semiconductor element 4 such as power transistor and diode, a radiator 3, a connection terminal 6 or the like is connected under heat to the wiring substrate 1 by brazing.

When the copper paste according to the embodiment of the present invention is used, the sinterability of copper is more enhanced and therefore, a wiring board having good plating or soldering property and reduced in the warping or waving can be obtained.

In the wiring board 1 according to the embodiment of the present invention, the conductor layer 10 has good plating or soldering property and does not cause plating bulge or separation even when the wiring substrate 1 is heated and therefore, a wiring board excellent in the high-density packaging can be obtained.

In the wiring board 1 according to the embodiment of the present invention, the conductor layer 10 is not separated or bulged even when a radiator 3, a cover 7, a connection terminal 6 or the like is connected by melting a brazing material 12 to 14 and therefore, a high reliability can be obtained particularly in a wiring board where a radiator, a connection terminal between circuit components, a semiconductor element of generating heat, and the like are mounted.

In the embodiment of the present invention, Ni and Au are plated on the top face of the conductor layer 10 and a radiator 3, a connection terminal 6, a cover 7 and the like are connected to this Au-plated face through a brazing material 12 to 14, however, in place of the plating by Ni and Au, other metal having low resistance may be plated. Furthermore, the present invention is not limited to perform the Au plating treatment but when brazing can be performed without fail by not applying a plating treatment, the plating treatment can be omitted.

In the embodiment of the present invention, a gold-germanium alloy is used as the brazing material but a solder or a copper alloy may also be used.

This application is based on Japanese Patent application JP 2002-208320, filed Jul. 17, 2002, the entire content of which is hereby incorporated by reference, the same as if set forth at length.

What is claimed is:

1. A wiring board comprising:
a conductor layer comprising Fe and Cu; and
at least one of a radiator, a connection terminal, a cover and a circuit component selected from the group consisting of a semiconductor element, a condenser, an inductor and a resistor, connected to the conductor layer through a joining member comprising a brazing material,
which wiring board is obtained by coating a copper paste comprising a copper powder, an organic vehicle and an $Fe_2O_3$ particle mainly comprising $Fe_2O_3$ as a conductor layer on a ceramic green sheet, and simultaneously firing the ceramic green sheet and coated copper paste.

2. The wiring board according to claim 1, wherein a surface of the conductor layer is subjected to a plating treatment.

3. The wiring board according to claim 1, wherein the copper paste comprises more than 20 parts by mass of the organic vehicle per 100 parts by mass of the copper powder.

4. The wiring board according to claim 1, wherein the copper paste comprises a ceramic particle having an average particle size of 100 nm or less selected from the group consisting of oxides of alkali metals and alkaline earth metals, $Al_2O_3$, $TiO_2$, $CeO_2$ and mullite.

5. The wiring board according to claim 4, wherein the ceramic particle having an average particle size of 100 nm or less has a hydrophilic surface.

6. The wiring board according to claim 4, wherein the ceramic particle having an average particle size of 100 nm or less comprises $TiO_2$.

7. The wiring board according to claim 1, which is obtained by a method comprising the steps of
coating the copper paste on a ceramic green sheet;
exposing the coated sheet to a wet nitrogen atmosphere at 650 to 900° C. so as to remove organic components; and
simultaneously firing the ceramic green sheet and coated copper paste at 850 to 1,050° C. after the exposing.

8. The wiring board according to claim 1, wherein said Fe2O3 particle has an average particle size of 1 μm or less.

9. A copper paste comprising a copper powder, an organic vehicle, an Fe2O3 particle mainly comprising Fe2O3, and
which comprises a ceramic particle having an average particle size of 100 nm or less selected from the group consisting of oxides of alkali metals and alkaline earth metals, $Al_2O_3$, $TiO_2$, $CeO_2$, and mullite.

10. The copper paste according to claim 9, wherein the copper paste comprises more than 20 parts by mass of the organic vehicle per 100 parts by mass of the copper powder.

11. The copper paste according to claim 9, wherein said Fe2O3 particle has an average particle size of 1 μm or less.

12. The copper paste according to claim 9, wherein the ceramic particle having an average particle size of 100 nm or less has a hydrophilic surface.

13. The copper paste according to claim 9, wherein the ceramic particle having an average particle size of 100 nm or less comprises $TiO_2$.

* * * * *